United States Patent [19]

Khanna et al.

[11] Patent Number: 4,988,959

[45] Date of Patent: Jan. 29, 1991

[54] YIG TUNED OSCILLATOR USING COMPOSITE FEEDBACK

[75] Inventors: Amarpal S. Khanna, San Jose; Derek Davis, Palo Alto, both of Calif.

[73] Assignee: Avantek, Inc., Milpitas, Calif.

[21] Appl. No.: 429,826

[22] Filed: Oct. 31, 1989

[51] Int. Cl.$^5$ ............................................. H03B 5/18
[52] U.S. Cl. ................................. 331/117 D; 331/96;
 331/117 FE
[58] Field of Search ............. 331/96, 107 DP, 117 R,
 331/117 FE, 117 D; 333/219.2, 235

[56] References Cited

U.S. PATENT DOCUMENTS

| | | | |
|---|---|---|---|
| 3,801,936 | 4/1974 | Roschmann | 333/73 C |
| 3,879,677 | 4/1975 | Arnold | 331/77 |
| 3,909,746 | 9/1975 | Abraham et al. | 331/96 |
| 4,270,097 | 5/1981 | Le Tron et al. | 331/96 |
| 4,290,017 | 9/1981 | Fortunko | 324/237 |
| 4,581,594 | 4/1986 | Kennedy | 331/177 |
| 4,626,800 | 12/1986 | Murakami et al. | 331/96 |
| 4,630,002 | 12/1986 | Leiba | 331/96 |
| 4,713,632 | 12/1987 | Nishikawa et al. | 331/117 |
| 4,737,737 | 4/1988 | Khanna | 331/47 |
| 4,755,772 | 7/1988 | Khanna | 331/117 D X |
| 4,758,800 | 7/1988 | DiBiase et al. | 331/1 R |
| 4,758,804 | 7/1988 | Inoue et al. | 331/99 |
| 4,849,716 | 7/1989 | Golio et al. | 331/117 D X |

OTHER PUBLICATIONS

Schiebold, Christopher F., "An Approach to Realizing Multi-Octave Performance in GaAs-FET YIG-Tuned Oscillators", 1985 *IEEE MTT-S Digest*, pp. 261-263.
Obregon, et al., "Decade Bandwidth FET Functions", 1981 *IEEE*, pp. 141-142.

*Primary Examiner*—David Mis
*Attorney, Agent, or Firm*—Limbach, Limbach & Sutton

[57] ABSTRACT

A broadband YIG-tuned oscillator is disclosed that has both series and parallel feedback provided by a YIG sphere. The oscillator includes a transistor capable of driving a load coupled to a first port of the transistor, a reactive feedback element coupled to a second port of the transistor, a YIG resonator, and coupling means for coupling the YIG resonator to both a third port of the transistor and to the first port of the transistor.

8 Claims, 1 Drawing Sheet ured in accordance with the principles discussed above.

YIG TUNED OSCILLATOR USING COMPOSITE FEEDBACK

BACKGROUND OF THE INVENTION

1. Field of the Invention

This invention relates generally to microwave-frequency oscillators, and relates more particularly to a YIG tuned oscillator having both series and parallel feedback.

2. Description of the Relevant Art

Prior wideband, microwave-frequency oscillators have used yttrium-iron-garnet (YIG) spheres as resonant elements and transistors, either bipolar or field-effect, as active elements. These oscillators are commonly known as YIG-tuned oscillators (YTO). One or more reactive elements coupled to the transistor establish the conditions for oscillation. The YIG sphere is placed in a magnetic field and resonates in accordance with the strength of that magnetic field. Such an oscillator is tuned by varying the magnetic field applied to the YIG, thus changing the resonant frequency of the YIG and the frequency of the oscillator. The YIG sphere is RF-coupled to the transistor, forming either a series or parallel feedback element.

In oscillators using the YIG as a series feedback element, the oscillator makes use of the reflection gain ($S_{11}$) of the transistor element to establish conditions for oscillation. A typical series feedback YIG oscillator, using a common-base bipolar transistor as the active element, would couple an inductor to the base of the transistor as a reactive element and would RF couple the YIG sphere to the emitter of the transistor. A shunt capacitor and the output load would be connected to the collector of the transistor. To maximize tuning range, the base inductance and collector shunt capacitance would be selected for achieving negative resistance in the widest band possible. This design is limited by the difficult in achieving negative resistance at both the low and high end of the frequency band.

On the other hand, oscillators using the YIG as a parallel feedback element use the transmission gain ($S_{21}$) of the transistor to power the oscillator. A typical parallel feedback oscillator, again using a common emitter bipolar transistor as the active element, would couple the YIG between the collector and the base of the transistor and would feedback to the base part of the output power supplied by the collector. Since the YIG in this configuration would provide reactive feedback, no reactive component apart from the YIG is needed. Oscillators of this type typically operate at lower frequencies than series feedback oscillators.

SUMMARY OF THE INVENTION

In accordance with the illustrated preferred embodiment, the present invention provides a broadband YIG-tuned oscillator having both series and parallel feedback, thereby expanding the frequency range of operation. The oscillator includes: (1) a transistor capable of driving a load coupled to a first port thereof; (2) a reactive feedback element coupled to a second port of the transistor; (3) a YIG resonator including means for tuning a YIG crystal for resonance throughout a range of frequencies; and (4) coupling means for coupling the YIG resonator to both a third port of the transistor and to the first port of the transistor. The YIG is coupled to the transistor as both a series and parallel feedback element and makes use of both the reflection gain at the third port and transmission gain of the transistor between the first and third ports.

DETAILED DESCRIPTION OF THE PREFERRED EMBODIMENT

FIGS. 1 through 5 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

Figure 1:
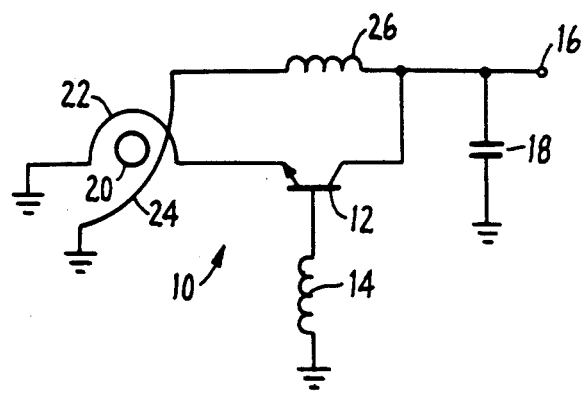
FIG. 1 is a schematic diagram of a wideband YIG-tuned oscillator in accordance with the present invention, using a common-base bipolar transistor.

The preferred embodiment of the present invention is a broadband YIG-tuned oscillator having both series and parallel feedback. As shown in FIG. 1, one implementation of the invention utilizes a common-base, bipolar transistor 12 as the active element of the oscillator 10. The base of transistor 12 is coupled to ground through an inductor 14, which provides reactive feedback for the oscillator 10. The load is coupled to an output terminal 16, which is connected to the collector of transistor 12 and is shunted to ground by a shunt capacitor 18. A YIG sphere 20 is RF coupled to both the collector and emitter of transistor 12 by two coupling loops 22 and 24. Coupling loop 22 couples the YIG sphere 20 to the emitter, while coupling loop 24 couples the YIG sphere 20 through an inductor 26 to the collector. The ends of coupling loops 22 and 24 opposite the transistor connection are grounded. The loops 22 and 24, coupled through the YIG sphere 20, thus form a parallel feedback circuit between the emitter and collector of the transistor.

Figure 2:
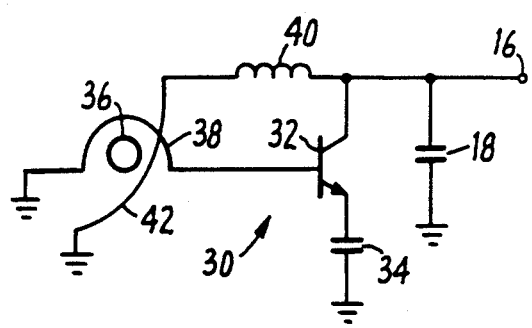
FIG. 2 is an alternative embodiment of the present invention using a common-emitter bipolar transistor.

An alternative oscillator 30, using a common-emitter, bipolar transistor 32, is shown in FIG. 2. The emitter of transistor 32 is coupled to ground through a capacitor 34, which provides reactive feedback for the oscillator 30. Once again, the output load is coupled to the collector of the transistor. A YIG sphere 36 is RF coupled to the base of the transistor through one coupling loop 38 and to the collector of the transistor through an inductor 40 and another coupling loop 42.

Figure 3:
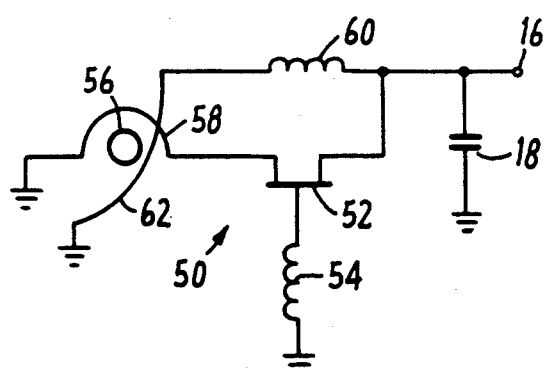
FIG. 3 is an alternative embodiment of the present invention using a common-gate field-effect transistor.
Figure 4:
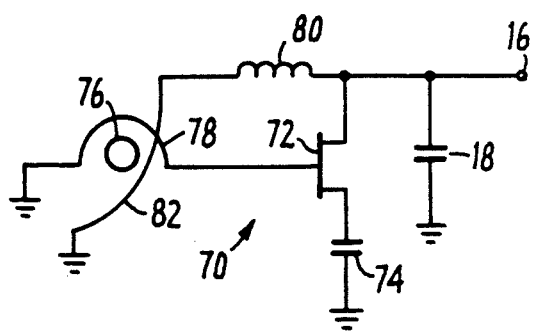
FIG. 4 is an alternative embodiment of the present invention using a common-source field-effect transistor.

Two alternative oscillators 50 and 70, using field-effect transistors (FET), are shown in FIGS. 3 and 4. The FET 52 of oscillator 50 is configured as a common gate, with its gate coupled to ground through an inductor 54, which provides reactive feedback to the oscillator. The output load is coupled to the drain of the transistor 52. A YIG sphere 56 is RF coupled to the source of the transistor by a coupling loop 58 and to the drain by an inductor 60 and another coupling loop 62.

Oscillator 70 has its FET 72 in a common-source configuration, with the source coupled to ground through a capacitor 74, which provides reactive feedback. The output load is coupled to the drain of the transistor 72. A YIG sphere 76 is RF coupled to the gate of the transistor by a coupling loop 78 and to the drain by an inductor 80 and another coupling loop 82.

In all four of the above-described oscillators, the YIG sphere is used for both series and parallel feedback. The positive $S_{21}$ transmission gain predominates at frequencies in the lower end of the microwave frequency range, while the $S_{11}$ reflection gain (negative resistance) predominates at frequencies in the upper end of the microwave frequency range. The positive $S_{21}$ transmission gain is supplied through the YIG in its parallel feedback path, while the $S_{11}$ reflection gain is supplied through the YIG in its series feedback path.

Figure 5:
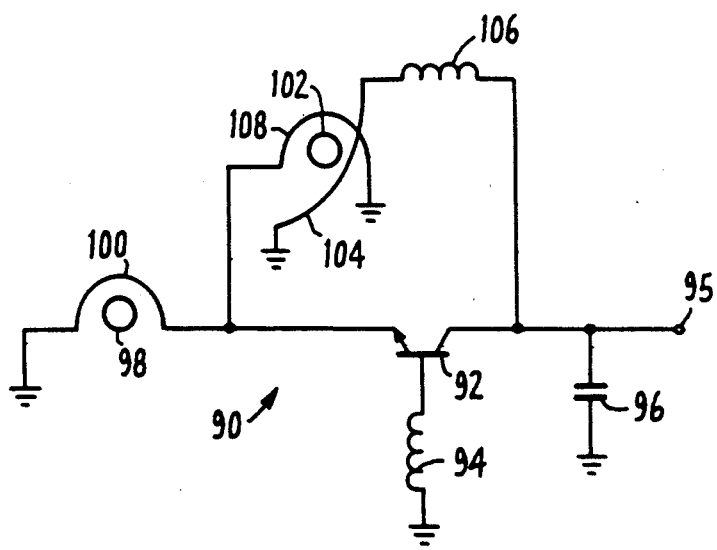
FIG. 5 is an alternative embodiment of the present invention using two YIG resonators.

The frequency range of a single YIG approach can be extended by adding a second YIG sphere optimized for low-frequency resonance. As shown in FIG. 5, oscillator 90 has a common-base, bipolar transistor 92, although a common-emitter bipolar transistor or common-gate or common-source FET could be substituted. The base of transistor 92 is coupled to ground by an inductor 94 that provides sufficient reactive feedback. The collector of transistor 92 is connected to the output load at terminal 95 and is shunted to ground through capacitor 96. One YIG sphere 98 is coupled to the emitter of the transistor through a coupling loop 100 to provide series feedback. A second YIG sphere 102 provides parallel feedback, and is coupled through a coupling loop 104 and an inductor 106 to the collector and through another coupling loop 108 to the emitter.

The two YIG spheres 98 and 102 of oscillator 90 are each optimized for operation in their respective realms of operation. YIG 98, which provides series feedback at high frequencies, is selected for resonance at high frequencies. YIG 102, which provides parallel feedback at low frequencies, is selected for resonance at low frequencies. Since the lower frequency limit of operation of a YIG is proportional to the value of its saturation magnetization, this value is chosen to be lower in YIG 102 than YIG 98. This extends the lower limit of the frequency range over the single YIG oscillators of FIG. 1–4.

From the above description, it will be apparent that the invention disclosed herein provides a novel and advantageous broadband YIG-tuned oscillator having both series and parallel feedback. The foregoing discussion discloses and describes merely exemplary methods and embodiments of the present invention. As will be understood by those familiar with the art, the invention may be embodied in other specific forms without departing from the spirit or essential characteristics thereof. For example, a YIG resonator in a form other than a sphere could be substituted for the YIG spheres as described. Accordingly, the disclosure of the present invention is intended to be illustrative, but not limiting, of the scope of the invention, which is set forth in the following claims.

What is claimed is:

1. A YIG-tuned oscillator comprising:
   a transistor capable of oscillating in the microwave-frequency range and capable of driving a load coupled to a first port thereof;
   a reactive feedback element coupled to a second port of the transistor;
   one or more YIG resonators including means for tuning the YIG resonators for resonance throughout a range of frequencies; and
   coupling means for coupling the one or more YIG resonators to a third port of the transistor and to the first port of the transistor for providing both series and parallel resonant feedback to the transistor.

2. A YIG-tuned oscillator comprising:
   a transistor capable of oscillating in the microwave-frequency range and capable of driving a load coupled to a first port thereof;
   a reactive feedback element coupled to a second port of the transistor;
   a YIG resonator including means for tuning a YIG crystal for resonance throughout a range of frequencies; and
   coupling means for coupling the YIG resonator to a third port of the transistor and to the first port of the transistor.

3. An oscillator as recited in claim 2 wherein the transistor is a bipolar transistor having its collector coupled to the load, wherein the reactive feedback element is an inductor coupled to the base of the transistor, wherein the coupling means couples the YIG resonator to the emitter of the transistor and couples the YIG resonator and an inductor in series to the collector of the transistor.

4. An oscillator as recited in claim 2 wherein the transistor is a bipolar transistor having its collector coupled to the load, wherein the reactive feedback element is a capacitor coupled to the emitter of the transistor, wherein the coupling means couples the YIG resonator to the base of the transistor and couples the YIG resonator and an inductor in series to the collector of the transistor.

5. An oscillator as recited in claim 2 wherein the transistor is a field-effect transistor having its drain coupled to the load, wherein the reactive feedback element is an inductor coupled to the gate of the transistor, wherein the coupling means couples the YIG resonator to the source of the transistor and couples the YIG resonator and an inductor in series to the drain of the transistor.

6. An oscillator as recited in claim 2 wherein the transistor is a field-effect transistor having its drain coupled to the load, wherein the reactive feedback element is a capacitor coupled to the source of the transistor, wherein the coupling means couples the YIG resonator to the gate of the transistor and couples the YIG resonator and an inductor in series to the drain of the transistor.

7. A YIG-tuned oscillator comprising:
   a transistor capable of oscillating in the microwave-frequency range and capable of driving a load coupled to a first port thereof;
   a reactive feedback element coupled to a second port of the transistor;
   a first YIG resonator including means for tuning a first YIG crystal for resonance throughout a first range of frequencies;
   first coupling means for coupling the first YIG resonator to a third port of the transistor;
   a second YIG resonator including means for tuning a second YIG crystal for resonance throughout a second range of frequencies that is lower than the first range of frequencies; and
   second coupling means for coupling the second YIG resonator between the first and third ports of the transistor.

8. An oscillator as recited in claim 7 wherein the transistor is a bipolar transistor having its collector coupled to the load, wherein the reactive feedback element is an inductor coupled to the base of the transistor, wherein the first coupling means couples the first YIG resonator to the emitter of the transistor, and wherein the second coupling means couples the second YIG resonator to the emitter of the transistor and couples the second YIG resonator and an inductor in series to the collector of the transistor.

* * * * *